(12) United States Patent
Kost et al.

(10) Patent No.: US 9,496,844 B1
(45) Date of Patent: Nov. 15, 2016

(54) VARIABLE BANDWIDTH FILTER FOR DIMMER PHASE ANGLE MEASUREMENTS

(71) Applicant: KONINKLIJKE PHILIPS N.V., Eindhoven (NL)

(72) Inventors: Michael A. Kost, Austin, TX (US); Eric J. King, Dripping Springs, TX (US)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 230 days.

(21) Appl. No.: 14/102,135

(22) Filed: Dec. 10, 2013

Related U.S. Application Data (60) Provisional application No. 61/756,732, filed on Jan. 25, 2013.

(51) Int. Cl.
*H03H 7/19* (2006.01)
*H05B 33/08* (2006.01)
*H05B 37/02* (2006.01)

(52) U.S. Cl.
CPC ............ *H03H 7/19* (2013.01); *H05B 33/0845* (2013.01); *H05B 37/02* (2013.01)

(58) Field of Classification Search
USPC .................................................. 315/291–311
See application file for complete search history.

(56) References Cited

U.S. PATENT DOCUMENTS

| | | | |
|---|---|---|---|
| 4,523,128 A | 6/1985 | Stamm et al. |
| 5,055,746 A | 10/1991 | Feng-Kang et al. |
| 5,179,324 A | 1/1993 | Audbert |
| 5,319,301 A | 6/1994 | Callahan et al. |
| 5,321,350 A | 6/1994 | Haas |
| 5,430,635 A | 7/1995 | Liu |
| 5,691,605 A | 11/1997 | Xia et al. |
| 5,770,928 A | 6/1998 | Chansky et al. |
| 6,043,635 A | 3/2000 | Downey |
| 6,046,550 A | 4/2000 | Ference et al. |
| 6,091,205 A | 7/2000 | Newman et al. |
| 6,211,624 B1 | 4/2001 | Holzer |
| 6,380,692 B1 | 4/2002 | Newman et al. |
| 6,407,514 B1 | 6/2002 | Glaser et al. |
| 6,510,995 B2 | 1/2003 | Muthu |
| 6,621,256 B2 | 9/2003 | Muratov et al. |
| 6,713,974 B2 | 3/2004 | Patchornik et al. |

(Continued)

FOREIGN PATENT DOCUMENTS

| | | |
|---|---|---|
| CN | 101637064 A | 1/2010 |
| CN | 101505568 A | 10/2012 |

(Continued)

OTHER PUBLICATIONS

Amanci, et al, "Synchronization System with Zero-Crossing Peak Detection Algorithm for Power System Applications", The 2010 International Power Electronics Conference, pp. 2984-2991, Toronto, Ontario, Canada.

(Continued)

*Primary Examiner* — Brandon S. Cole (57) ABSTRACT

In accordance with systems and methods of the present disclosure, an apparatus may include a variable bandwidth filter having an input for receiving an input signal and an output for receiving an output signal, wherein the output signal is generated by filtering the input signal in conformity with a variable bandwidth of the variable bandwidth filter and the variable bandwidth is set based on an integrated error between the input signal and the output signal.

20 Claims, 4 Drawing Sheets

(56) References Cited

U.S. PATENT DOCUMENTS

| | | |
|---|---|---|
| 6,714,425 B2 | 3/2004 | Yamada et al. |
| 6,858,995 B2 | 2/2005 | Lee et al. |
| 6,900,599 B2 | 5/2005 | Ribarich |
| 7,102,902 B1 | 9/2006 | Brown et al. |
| 7,180,250 B1 | 2/2007 | Gannon |
| 7,184,937 B1 | 2/2007 | Su et al. |
| 7,339,329 B2 | 3/2008 | Makimura et al. |
| 7,656,103 B2 | 2/2010 | Shteynberg et al. |
| 7,719,246 B2 | 5/2010 | Melanson |
| 7,728,530 B2 | 6/2010 | Wang et al. |
| 7,733,678 B1 | 6/2010 | Notohamiprodjo et al. |
| 7,759,881 B1 | 7/2010 | Melanson |
| 7,786,711 B2 | 8/2010 | Wei et al. |
| 7,872,427 B2 | 1/2011 | Scianna |
| 8,102,167 B2 | 1/2012 | Irissou et al. |
| 8,115,419 B2 | 2/2012 | Given et al. |
| 8,169,154 B2 | 5/2012 | Thompson et al. |
| 8,212,491 B2 | 7/2012 | Kost |
| 8,212,492 B2 | 7/2012 | Lam et al. |
| 8,222,832 B2 | 7/2012 | Zheng et al. |
| 8,482,220 B2 | 7/2013 | Melanson |
| 8,487,546 B2 | 7/2013 | Melanson |
| 8,508,147 B2 | 8/2013 | Shen |
| 8,536,794 B2 | 9/2013 | Melanson et al. |
| 8,536,799 B1 | 9/2013 | Grisamore et al. |
| 8,547,034 B2 | 10/2013 | Melanson et al. |
| 8,569,972 B2 | 10/2013 | Melanson |
| 8,581,518 B2 | 11/2013 | Kuang et al. |
| 8,610,364 B2 | 12/2013 | Melanson et al. |
| 8,610,365 B2 | 12/2013 | King et al. |
| 8,664,885 B2 | 3/2014 | Koolen et al. |
| 8,716,957 B2 | 5/2014 | Melanson et al. |
| 8,749,173 B1 | 6/2014 | Melanson et al. |
| 8,829,819 B1* | 9/2014 | Angeles ............ H05B 33/0815 315/219 |
| 8,847,515 B2 | 9/2014 | King et al. |
| 9,215,772 B2 | 12/2015 | Sood et al. |
| 2002/0140371 A1 | 10/2002 | Chou et al. |
| 2004/0105283 A1 | 6/2004 | Schie et al. |
| 2004/0212321 A1 | 10/2004 | Lys |
| 2006/0022648 A1 | 2/2006 | Ben-Yaakov et al. |
| 2006/0208669 A1 | 9/2006 | Huynh et al. |
| 2007/0081611 A1* | 4/2007 | Fudge .................... G01S 7/021 375/316 |
| 2007/0182338 A1 | 8/2007 | Shteynberg et al. |
| 2007/0182347 A1 | 8/2007 | Shteynberg |
| 2008/0018261 A1 | 1/2008 | Kastner |
| 2008/0101098 A1 | 5/2008 | Disney |
| 2008/0143266 A1 | 6/2008 | Langer |
| 2008/0192509 A1 | 8/2008 | Dhuyvetter et al. |
| 2008/0205103 A1 | 8/2008 | Sutardja et al. |
| 2008/0224629 A1 | 9/2008 | Melanson |
| 2008/0224633 A1* | 9/2008 | Melanson .......... H05B 33/0809 315/292 |
| 2008/0224636 A1 | 9/2008 | Melanson |
| 2008/0225168 A1* | 9/2008 | Ouslis ................ H04N 5/4401 348/554 |
| 2009/0044087 A1* | 2/2009 | Chen .................... H04L 1/0045 714/800 |
| 2009/0134817 A1 | 5/2009 | Jurngwirth et al. |
| 2009/0135632 A1 | 5/2009 | Sohma |
| 2009/0195186 A1 | 8/2009 | Guest et al. |
| 2009/0284182 A1 | 11/2009 | Cencur |
| 2010/0002480 A1 | 1/2010 | Huynh et al. |
| 2010/0013405 A1 | 1/2010 | Thompson et al. |
| 2010/0013409 A1 | 1/2010 | Quek et al. |
| 2010/0066328 A1 | 3/2010 | Shimizu et al. |
| 2010/0164406 A1 | 7/2010 | Kost et al. |
| 2010/0213859 A1 | 8/2010 | Shteynberg et al. |
| 2010/0231136 A1 | 9/2010 | Reisenbauer et al. |
| 2010/0244726 A1 | 9/2010 | Melanson |
| 2011/0043133 A1 | 2/2011 | Van Laanen et al. |
| 2011/0080110 A1 | 4/2011 | Nuhfer et al. |
| 2011/0084622 A1 | 4/2011 | Barrow et al. |
| 2011/0084623 A1 | 4/2011 | Barrow |
| 2011/0115395 A1 | 5/2011 | Barrow et al. |
| 2011/0121754 A1 | 5/2011 | Shteynberg |
| 2011/0148318 A1 | 6/2011 | Shackle et al. |
| 2011/0204797 A1 | 8/2011 | Lin et al. |
| 2011/0204803 A1 | 8/2011 | Grotkowski et al. |
| 2011/0234115 A1 | 9/2011 | Shimizu et al. |
| 2011/0266968 A1 | 11/2011 | Bordin et al. |
| 2011/0291583 A1 | 12/2011 | Shen |
| 2011/0309759 A1 | 12/2011 | Shteynberg et al. |
| 2012/0025724 A1 | 2/2012 | Melanson et al. |
| 2012/0043913 A1* | 2/2012 | Melanson .......... H05B 33/0815 315/307 |
| 2012/0049752 A1* | 3/2012 | King .................. H05B 33/0815 315/210 |
| 2012/0068626 A1 | 3/2012 | Lekatsas et al. |
| 2012/0098454 A1 | 4/2012 | Grotkowski et al. |
| 2012/0112651 A1 | 5/2012 | King et al. |
| 2012/0133291 A1 | 5/2012 | Kitagawa et al. |
| 2012/0286686 A1 | 11/2012 | Watanabe et al. |
| 2013/0015768 A1 | 1/2013 | Roberts et al. |
| 2013/0049621 A1* | 2/2013 | Yan ................... H05B 33/0848 315/205 |
| 2013/0083424 A1* | 4/2013 | Iwashiro ............ G11B 5/59622 360/75 |
| 2013/0154495 A1 | 6/2013 | Zhaohui |
| 2013/0241441 A1 | 9/2013 | Myers et al. |
| 2013/0342123 A1 | 12/2013 | Melanson et al. |
| 2014/0009078 A1 | 1/2014 | Xie et al. |
| 2014/0009082 A1 | 1/2014 | King et al. |
| 2014/0028214 A1 | 1/2014 | Mazumdar et al. |
| 2015/0256091 A1 | 9/2015 | Melanson |
| 2015/0305107 A1 | 10/2015 | Sood et al. |

FOREIGN PATENT DOCUMENTS

| | | |
|---|---|---|
| EP | 1164819 A1 | 12/2001 |
| EP | 2257124 A1 | 1/2010 |
| EP | 2232949 B1 | 9/2010 |
| JP | 2008053181 A | 3/2008 |
| JP | 2009170240 A | 7/2009 |
| WO | 9917591 A1 | 4/1999 |
| WO | 2002096162 A1 | 11/2002 |
| WO | 2006079937 A1 | 8/2006 |
| WO | 2008029108 A1 | 3/2008 |
| WO | 2008112735 A2 | 9/2008 |
| WO | 2008112822 A2 | 9/2008 |
| WO | 2010011971 A1 | 1/2010 |
| WO | 2010027493 A2 | 3/2010 |
| WO | 2010035155 A2 | 4/2010 |
| WO | 2011008635 A1 | 1/2011 |
| WO | 2011050453 A1 | 5/2011 |
| WO | 2011056068 A2 | 5/2011 |
| WO | 2012016197 A1 | 2/2012 |

OTHER PUBLICATIONS

AZOTEQ, IQS17 Family, IQ Switch—ProxSense Series, IQS17 Datasheet V2.00.doc, Jan. 2007, pp. 1-51.

Chan et al, Design and Implementation of Dimmable Electronic Ballast Based on Integrated Inductor, IEEE Transactions on Power Electronics, vol. 22, No. 1, Jan. 2007, pp. 291-300.

Gonthier et al, EN55015 Compliant 500W Dimmer with Low-Losses Symmetrical Switches, EPE 2005—Dresden, 9 pages.

Green, A ballast that can be dimmed from a domestic (phase cut) dimmer, International Rectifier, El Segundo, CA, IRPLCFL3 rev.b, Aug. 25, 2003, 12 pages.

Hausman, Real-Time Illumination Stability Systems for Trailing-Edge (Reverse Phase Control) Dimmers, Technical white paper, Dec. 2004, version 1.0, Lutron Electronics Co. Inc., Coopersburg, PA.

Lee et al, A Novel Electrode Power Profiler for Dimmable Ballasts Using DC Link Voltage and Switching Frequency Controls, IEEE Transactions on Power Electronics, vol. 19, No. 3, May 2004, pp. 847-853.

Light Dimmer Circuits, www.epanorama.net, 9 pages.

Lutron, Flourescent dimming systems technical guide, Lutron Electronics Co., Inc., Coopersburg, PA, 2002, 28 pages.

(56) References Cited

OTHER PUBLICATIONS

Lutron, Why Different Dimming Ranges? The Difference Between Measured and Perceived Light, 1 page.

O'Rourke, "Dimming Electronic Ballasts," National Lighting Product Information Program, Specifier Reports, vol. 7, No. 3, Oct. 1999, pp. 1-24.

Patterson, James, "Efficient Method for Interfacing TRIAC Dimmers and LEDs", National Semiconductor Corp., EDN, pp. 29-32, Jun. 23, 2011, USA.

Rand et al: "Issues, Models and Solutions for Triac Modulated Phase Dimming of LED Lamps" Power Electronics Specialists Conference, 2007, PESC 2007, IEEE, IEEE, P1, Jun. 1, 2007, pp. 1398-1404.

SUPERTEX Inc, 56W Off-line LED Driver, 120VAC with PFC, 160V, 350mA Load, Dimmer Switch Compatible, Supertex, Inc., Sunnyvale CA, pp. 1-20.

Vainio, Olli, "Digital Filtering for Robust 50/60 Hz Zero-Crossing Detectors", IEEE Transactions on Instrumentation and Measurement, vol. 45, No. 2, Apr. 1996, pp. 426-430.

Wu et al, Single-Stage Electronic Ballast with Dimming Feature and Unity Power Factor, IEEE Transactions on Power Electronics, vol. 13, No. 3, May 1998, pp. 586-597.

Supertex, Inc., HV9931 Unity Power Factor LED Lamp Drive, pp. 1-7, 2005, Sunnyvale, CA, US.

International Search Report and Written Opinion, International Patent Application No. PCT/US2015/017109, mailed Jul. 1, 2015, 10 pages.

International Search Report and Written Opinion, International Patent Application No. PCT/US2015/026196, mailed Sep. 24, 2015, 9 pages.

\* cited by examiner

VARIABLE BANDWIDTH FILTER FOR DIMMER PHASE ANGLE MEASUREMENTS

RELATED APPLICATIONS

The present disclosure claims priority to U.S. Provisional Patent Application Ser. No. 61/756,732, filed Jan. 25, 2013, which is incorporated by reference herein in its entirety.

FIELD OF DISCLOSURE

The present disclosure relates in general to the field of electronics, and more specifically to systems and methods for ensuring compatibility between one or more low-power lamps and the power infrastructure to which they are coupled.

BACKGROUND

Many electronic systems include circuits, such as switching power converters or transformers that interface with a dimmer. The interfacing circuits deliver power to a load in accordance with the dimming level set by the dimmer. For example, in a lighting system, dimmers provide an input signal to a lighting system. The input signal represents a dimming level that causes the lighting system to adjust power delivered to a lamp, and, thus, depending on the dimming level, increase or decrease the brightness of the lamp. Many different types of dimmers exist. In general, dimmers generate an output signal in which a portion of an alternating current ("AC") input signal is removed or zeroed out. For example, some analog-based dimmers utilize a triode for alternating current ("triac") device to modulate a phase angle of each cycle of an alternating current supply voltage. This modulation of the phase angle of the supply voltage is also commonly referred to as "phase cutting" the supply voltage. Phase cutting the supply voltage reduces the average power supplied to a load, such as a lighting system, and thereby controls the energy provided to the load.

A particular type of a triac-based, phase-cutting dimmer is known as a leading-edge dimmer. A leading-edge dimmer phase cuts from the beginning of an AC cycle, such that during the phase-cut angle, the dimmer is "off" and supplies no output voltage to its load, and then turns "on" after the phase-cut angle and passes phase cut input signal to its load. To ensure proper operation, the load must provide to the leading-edge dimmer a load current sufficient to maintain an inrush current above a current necessary for opening the triac. Due to the sudden increase in voltage provided by the dimmer and the presence of capacitors in the dimmer, the current that must be provided is typically substantially higher than the steady state current necessary for triac conduction. Additionally, in steady state operation, the load must provide to the dimmer a load current to remain above another threshold known as a "hold current" needed to prevent premature disconnection of the triac.

Figure 1:
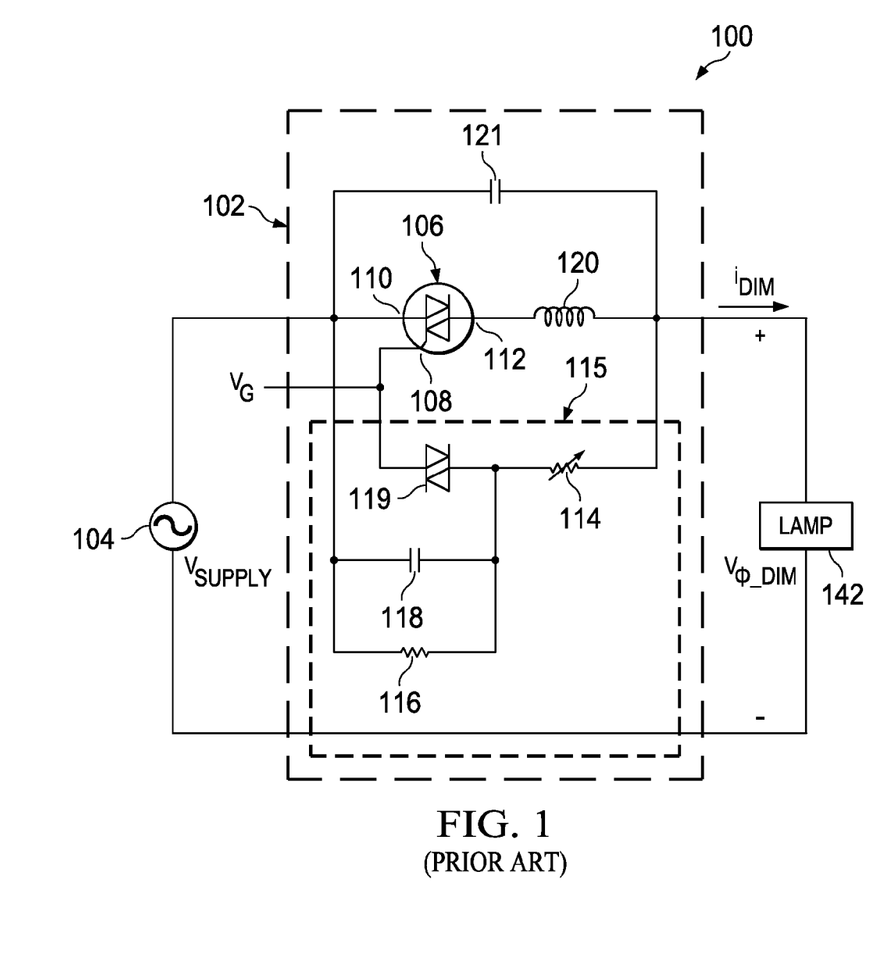
FIG. 1 illustrates a lighting system that includes a triac-based leading-edge dimmer, as is known in the art.
Figure 2:
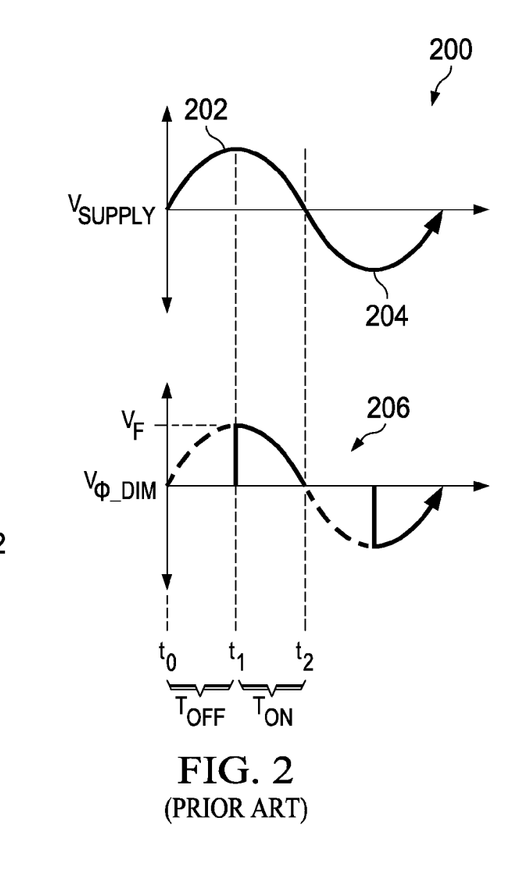
FIG. 2 illustrates example voltage and current graphs associated with the lighting system depicted in FIG. 1, as is known in the art.

FIG. 1 depicts a lighting system 100 that includes a triac-based leading-edge dimmer 102 and a lamp 142. FIG. 2 depicts example voltage and current graphs associated with lighting system 100. Referring to FIGS. 1 and 2, lighting system 100 receives an AC supply voltage $V_{SUPPLY}$ from voltage supply 104. The supply voltage $V_{SUPPLY}$ is, for example, a nominally 60 Hz/110 V line voltage in the United States of America or a nominally 50 Hz/220 V line voltage in Europe. Triac 106 acts as a voltage-driven switch, and a gate terminal 108 of triac 106 controls current flow between the first terminal 110 and the second terminal 112. A gate voltage $V_G$ on the gate terminal 108 above a firing threshold voltage value $V_F$ will cause triac 106 to turn ON, in turn causing a short of capacitor 121 and allowing current to flow through triac 106 and dimmer 102 to generate an output current $i_{DIM}$.

Assuming a resistive load for lamp 142, the dimmer output voltage $V_{\Phi\_DIM}$ is zero volts from the beginning of each of half cycles 202 and 204 at respective times $t_0$ and $t_2$ until the gate voltage $V_G$ reaches the firing threshold voltage value $V_F$. Dimmer output voltage $V_{\Phi\_DIM}$ represents the output voltage of dimmer 102. During timer period $t_{OFF}$, the dimmer 102 chops or cuts the supply voltage $V_{SUPPLY}$ so that the dimmer output voltage $V_{\Phi\_DIM}$ remains at zero volts during time period $t_{OFF}$. At time $t_1$, the gate voltage $V_G$ reaches the firing threshold value $V_F$, and triac 106 begins conducting. Once triac 106 turns ON, the dimmer voltage $V_{\Phi\_DIM}$ tracks the supply voltage $V_{SUPPLY}$ during time period $t_{ON}$.

Once triac 106 turns ON, the current $i_{DIM}$ drawn from triac 106 must exceed an attach current $i_{ATT}$ in order to sustain the inrush current through triac 106 above a threshold current necessary for opening triac 106. In addition, once triac 106 turns ON, triac 106 continues to conduct current $i_{DIM}$ regardless of the value of the gate voltage $V_G$ as long as the current $i_{DIM}$ remains above a holding current value $i_{HC}$. The attach current value $i_{ATT}$ and the holding current value $i_{HC}$ is a function of the physical characteristics of the triac 106. Once the current $i_{DIM}$ drops below the holding current value $i_{HC}$, i.e. $i_{DIM} < i_{HC}$, triac 106 turns OFF (i.e., stops conducting), until the gate voltage $V_G$ again reaches the firing threshold value $V_F$. In many traditional applications, the holding current value $i_{HC}$ is generally low enough so that, ideally, the current $i_{DIM}$ drops below the holding current value $i_{HC}$ when the supply voltage $V_{SUPPLY}$ is approximately zero volts near the end of the half cycle 202 at time $t_2$.

The variable resistor 114 in series with the parallel connected resistor 116 and capacitor 118 form a timing circuit 115 to control the time $t_1$ at which the gate voltage $V_G$ reaches the firing threshold value $V_F$. Increasing the resistance of variable resistor 114 increases the time $t_{OFF}$, and decreasing the resistance of variable resistor 114 decreases the time $t_{OFF}$. The resistance value of the variable resistor 114 effectively sets a dimming value for lamp 142. Diac 119 provides current flow into the gate terminal 108 of triac 106. The dimmer 102 also includes an inductor choke 120 to smooth the dimmer output voltage $V_{\Phi\_DIM}$. Triac-based dimmer 102 also includes a capacitor 121 connected across triac 106 and inductor choke 120 to reduce electro-magnetic interference.

Ideally, modulating the phase angle of the dimmer output voltage $V_{\Phi\_DIM}$ effectively turns the lamp 142 OFF during time period $t_{OFF}$ and ON during time period $t_{ON}$ for each half cycle of the supply voltage $V_{SUPPLY}$. Thus, ideally, the dimmer 102 effectively controls the average energy supplied to lamp 142 in accordance with the dimmer output voltage $V_{\Phi\_DIM}$.

Another particular type of phase-cutting dimmer is known as a trailing-edge dimmer. A trailing-edge dimmer phase cuts from the end of an AC cycle, such that during the phase-cut angle, the dimmer is "off" and supplies no output voltage to its load, but is "on" before the phase-cut angle and in an ideal case passes a waveform proportional to its input voltage to its load.

Figure 3:
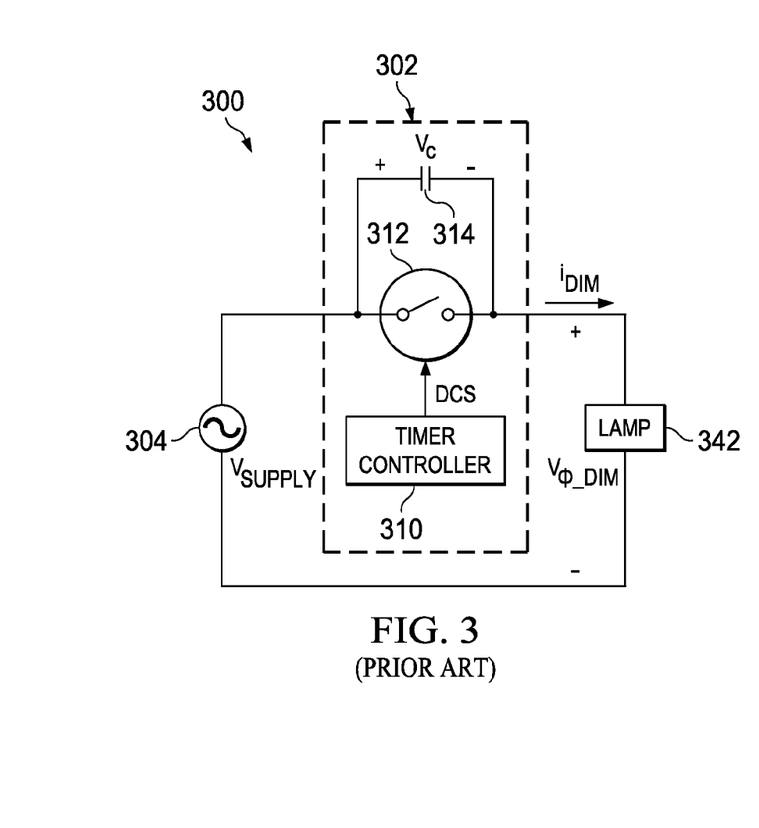
FIG. 3 illustrates a lighting system that includes a phase-cut trailing-edge dimmer, as is known in the art.
Figure 4:
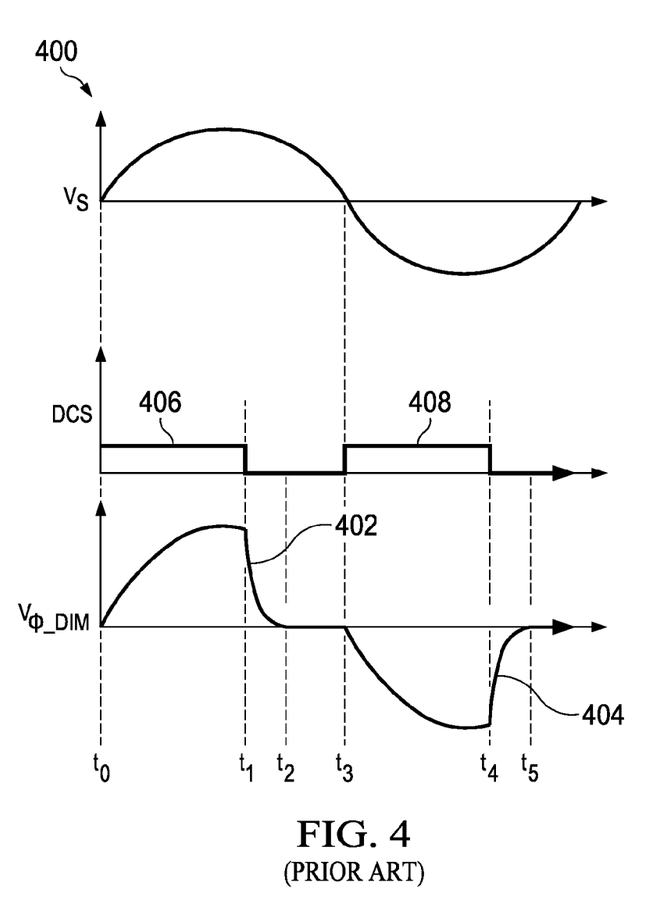
FIG. 4 illustrates example voltage and current graphs associated with the lighting system depicted in FIG. 3, as is known in the art.

FIG. 3 depicts a lighting system 300 that includes a trailing-edge, phase-cut dimmer 302 and a lamp 342. FIG. 4 depicts example voltage and current graphs associated with lighting system 300. Referring to FIGS. 3 and 4, lighting system 300 receives an AC supply voltage $V_{SUPPLY}$ from voltage supply 304. The supply voltage $V_{SUPPLY}$, indicated by voltage waveform 400, is, for example, a nominally 60 Hz/110 V line voltage in the United States of America or a nominally 50 Hz/220 V line voltage in Europe. Trailing-edge dimmer 302 phase cuts trailing edges, such as trailing edges 402 and 404, of each half cycle of supply voltage $V_{SUPPLY}$. Since each half cycle of supply voltage $V_{SUPPLY}$ is 180 degrees of the supply voltage $V_{SUPPLY}$, the trailing-edge dimmer 302 phase cuts the supply voltage $V_{SUPPLY}$ at an angle greater than 0 degrees and less than 180 degrees. The phase cut, input voltage $V_{\Phi\_DIM}$ to lamp 342 represents a dimming level that causes the lighting system 300 to adjust power delivered to lamp 342, and, thus, depending on the dimming level, increase or decrease the brightness of lamp 342.

Dimmer 302 includes a timer controller 310 that generates dimmer control signal DCS to control a duty cycle of switch 312. The duty cycle of switch 312 is a pulse width (e.g., times $t_1$-$t_0$) divided by a period of the dimmer control signal (e.g., times $t_3$-$t_0$) for each cycle of the dimmer control signal DCS. Timer controller 310 converts a desired dimming level into the duty cycle for switch 312. The duty cycle of the dimmer control signal DCS is decreased for lower dimming levels (i.e., higher brightness for lamp 342) and increased for higher dimming levels. During a pulse (e.g., pulse 406 and pulse 408) of the dimmer control signal DCS, switch 312 conducts (i.e., is "on"), and dimmer 302 enters a low resistance state. In the low resistance state of dimmer 302, the resistance of switch 312 is, for example, less than or equal to 10 ohms. During the low resistance state of switch 312, the phase cut, input voltage $V_{\Phi\_DIM}$ tracks the input supply voltage $V_{SUPPLY}$ and dimmer 302 transfers a dimmer current $i_{DIM}$ to lamp 342.

When timer controller 310 causes the pulse 406 of dimmer control signal DCS to end, dimmer control signal DCS turns switch 312 off, which causes dimmer 302 to enter a high resistance state (i.e., turns off). In the high resistance state of dimmer 302, the resistance of switch 312 is, for example, greater than 1 kiloohm Dimmer 302 includes a capacitor 314, which charges to the supply voltage $V_{SUPPLY}$ during each pulse of the dimmer control signal DCS. In both the high and low resistance states of dimmer 302, the capacitor 314 remains connected across switch 312. When switch 312 is off and dimmer 302 enters the high resistance state, the voltage $V_C$ across capacitor 314 increases (e.g., between times $t_1$ and $t_2$ and between times $t_4$ and $t_5$). The rate of increase is a function of the amount of capacitance C of capacitor 314 and the input impedance of lamp 342. If effective input resistance of lamp 342 is low enough, it permits a high enough value of the dimmer current $i_{DIM}$ to allow the phase cut, input voltage $V_{\Phi\_DIM}$ to decay to a zero crossing (e.g., at times $t_2$ and $t_5$) before the next pulse of the dimmer control signal DCS.

Dimming a light source with dimmers saves energy when operating a light source and also allows a user to adjust the intensity of the light source to a desired level. In an LED lighting system, there may exist a desire to maintain very narrow bandwidths in filtering control signals used to set the amount of light to be output by the LEDs (e.g., to reject noise, dimmer phase variation, other alternating current phenomena). However, there may also exist an opposing desire to maintain higher bandwidths to quickly respond to changes in a control setting of a dimmer. Such contrary requirements are not easily solved using traditional approaches, such as use of classic-low-pass filters or leaky integrators.

SUMMARY

In accordance with the teachings of the present disclosure, certain disadvantages and problems associated with ensuring compatibility of a low-power lamp with a dimmer and a transformer may be reduced or eliminated.

In accordance with embodiments of the present disclosure, an apparatus may include a variable bandwidth filter having an input for receiving an input signal and an output for generating an output signal. The output signal may be generated by filtering the input signal in conformity with a variable bandwidth of the variable bandwidth filter. The variable bandwidth may be set based on an integrated error between the input signal and the output signal.

In accordance with these and other embodiments, a method may include generating an output signal from an input signal by filtering the input signal in conformity with a variable bandwidth of a variable bandwidth filter. The method may also include setting the variable bandwidth based on an integrated error between the input signal and the output signal.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 5:
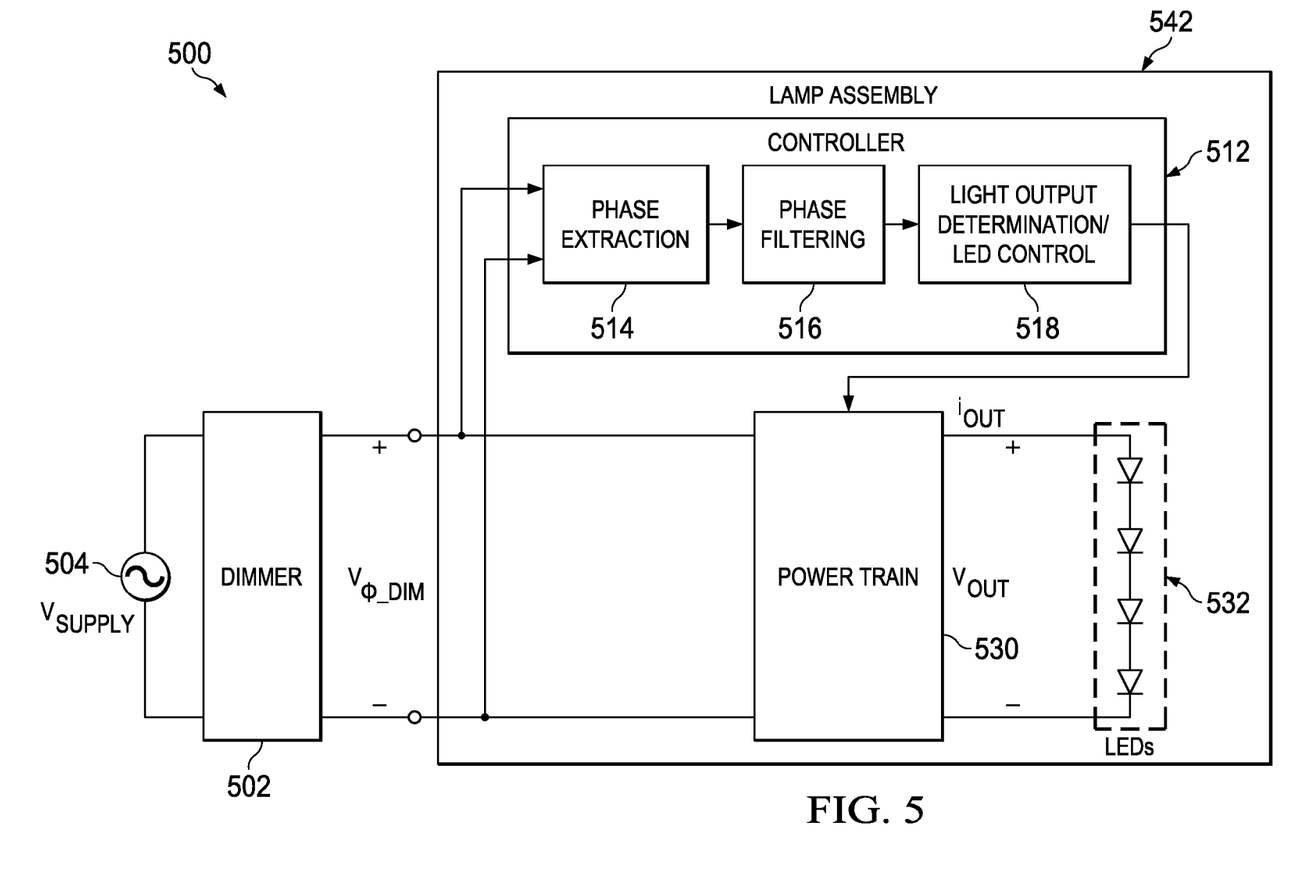
FIG. 5 illustrates an example lighting system including a controller for implementing a variable bandwidth filter for dimmer phase angle measurements, in accordance with embodiments of the present disclosure.

FIG. 5 illustrates an example lighting system 500 including a controller 512 for implementing a variable bandwidth filter for dimmer phase angle measurements in lighting system 500, in accordance with embodiments of the present disclosure. As shown in FIG. 5, lighting system 500 may include a voltage supply 504, a dimmer 502, and a lamp assembly 542. Voltage supply 504 may generate a supply voltage $V_{SUPPLY}$ that is, for example, a nominally 60 Hz/110 V line voltage in the United States of America or a nominally 50 Hz/220 V line voltage in Europe.

Dimmer 502 may comprise any system, device, or apparatus for generating a dimming signal to other elements of lighting system 500, the dimming signal representing a dimming level that causes lighting system 500 to adjust power delivered to a lamp, and, thus, depending on the dimming level, increase or decrease the brightness of lamp 542. Thus, dimmer 502 may include a leading-edge dimmer similar to that depicted in FIG. 1, a trailing-edge dimmer similar to that depicted in FIG. 3, or any other suitable dimmer.

Lamp assembly 542 may comprise any system, device, or apparatus for converting electrical energy (e.g., delivered from dimmer 502) into photonic energy (e.g., at LEDs 532). In some embodiments, lamp assembly 542 may comprise a multifaceted reflector form factor (e.g., an MR16 form factor). In these and other embodiments, lamp assembly 542 may comprise an LED lamp. As shown in FIG. 5, lamp assembly 542 may include a controller 512, a power train 530, and LEDs 532. LEDs 532 may comprise one or more light-emitting diodes configured to emit photonic energy in an amount based on the voltage $v_{OUT}$ across the LEDs 532.

Power train 530 may comprise any system, device, or apparatus for transferring electrical energy from its input terminals (e.g., from dimmer 502) to a load (e.g., LEDs 532) coupled to its output terminals in conformity with one or more control signals received from controller 512. Thus, in accordance with such one or more control signals, power train 530 may generate an output voltage $v_{OUT}$ and/or an output current $i_{OUT}$ for illuminating LEDs 532 or otherwise delivering electrical energy to a suitable load at the output terminals of power train 530. To carry out such functionality, power train 530 may include one or more of a signal rectifier (e.g., a bridge rectifier for rectifying dimmer output signal $V_{\Phi\_DIM}$, a boost converter, a buck converter, another type of power converter, a capacitor, and another type of energy storage device.

Controller 512 may comprise any system, device, or apparatus configured to, as described in greater detail elsewhere in this disclosure, determine one or more characteristics (e.g., phase angle of dimmer 502) of voltage $V_{\Phi\_DIM}$ present at the input of power train 530 and control energy transferred between the input of power train 530 to the output of power train 530 based on characteristics of voltage $V_{\Phi\_DIM}$.

In operation, controller 512 may receive and analyze voltage $V_{\Phi\_DIM}$ to determine a raw, instantaneous phase angle associated with a control setting of dimmer 502, as indicated by phase extraction block 514 shown in FIG. 5. Such raw phase angle values may be filtered as indicated by phase filtering block 516 in order to generate a filtered phase angle. As described in greater detail below, filtering of the extracted phase angle may be performed in conformity with a variable bandwidth filter, as described below in greater detail. Based on the filtered phase angle generated by phase filtering block 516, light output determination/LED control block 518 of controller 512 may generate a control signal for power train 530 such that the light intensity generated by LEDs 532 is in conformity with the filtered phase angle.

Figure 6:
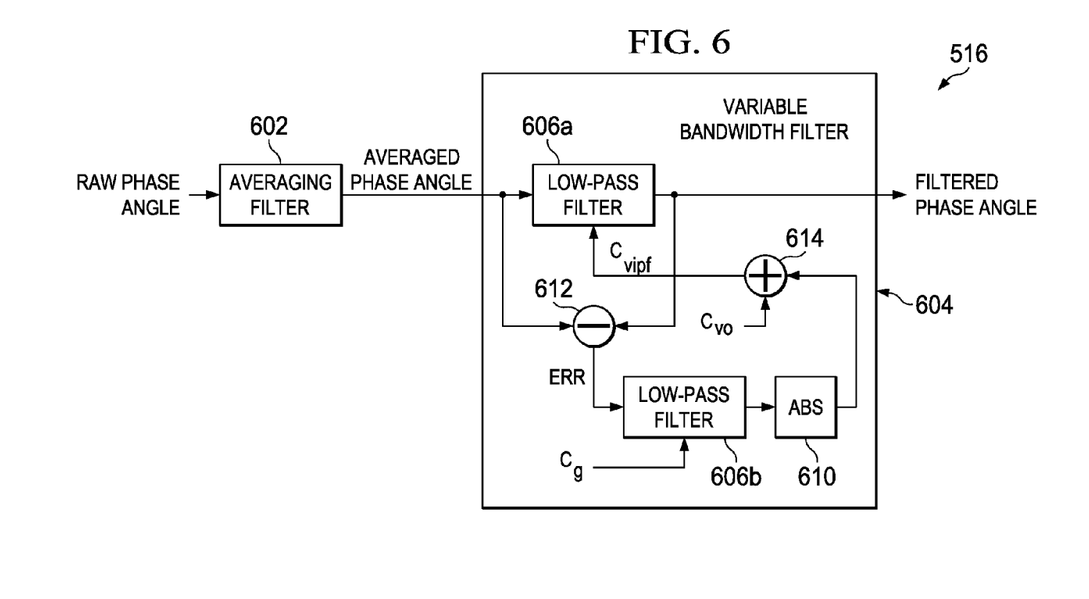
FIG. 6 illustrates an example phase filtering combination for use in the lighting system depicted in FIG. 5, in accordance with embodiments of the present disclosure.

FIG. 6 illustrates an example phase filtering combination for use in the lighting system depicted in FIG. 5, in accordance with embodiments of the present disclosure. The elements shown in FIG. 6 may be used alone or in combination with other elements to perform the functionality of phase filtering block 516. In certain embodiments, phase filtering block 516 may be implemented as a discrete-time filter at twice a power line frequency (e.g., 100 Hz or 120 Hz) of voltage power supply $V_{SUPPLY}$.

As shown in FIG. 6, a raw phase angle measurement, as extracted by phase extraction block 514, may be filtered by averaging filter 602 or other fixed-bandwidth filter to generate an averaged phase angle. Averaging filter 602 may have a transfer function which rejects high-frequency noise at the power line rate of $V_{SUPPLY}$ (e.g., dimmer phase variation, noise, etc.). Averaging filter 602 may be followed by a variable bandwidth filter 604, which generates a filtered phase angle from the averaged phase angle in conformity with a variable bandwidth of the variable bandwidth filter, wherein the variable bandwidth is set based on an integrated error between the averaged phase angle and the filtered bandwidth, as described in greater detail below.

As depicted in FIG. 6, variable bandwidth filter 604 may comprise low-pass filters 606a and 606b, an absolute value block 610, a subtractor 612, and a combiner 614. Low-pass filter 606a may generate an output filtered phase angle from the averaged phase angle generated by averaging filter 602 in accordance with a variable bandwidth coefficient $C_{vlpf}$ which itself is generated based on an error between the averaged phase angle and the filtered phase angle, as described below. The error ERR may be generated by subtractor 612, which may calculate a difference between the averaged phase angle and the filtered phase angle, and then filtered by low-pass filter 606b which may integrate the error ERR in conformity with a bandwidth coefficient $C_g$, which may be a constant set by a user and/or manufacturer of controller 512. Absolute value block 610 may output an absolute value of the integrated error generated by low-pass filter 606b, wherein such absolute value may be added to a constant coefficient $C_{vo}$ at combiner 614 or have some other mathematical transform performed on such absolute value in order to generate the variable bandwidth $C_{vlpf}$. In some embodiments, the constant $C_{vo}$ may establish a minimum variable bandwidth for variable bandwidth filter 604. Accordingly, as magnitude of the error ERR increases, so too will the bandwidth of variable bandwidth filter 604. Thus, variable bandwidth filter 604 may be well adapted to allow controller 512 to quickly respond to changes in a control setting of dimmer 502.

Figure 7A:
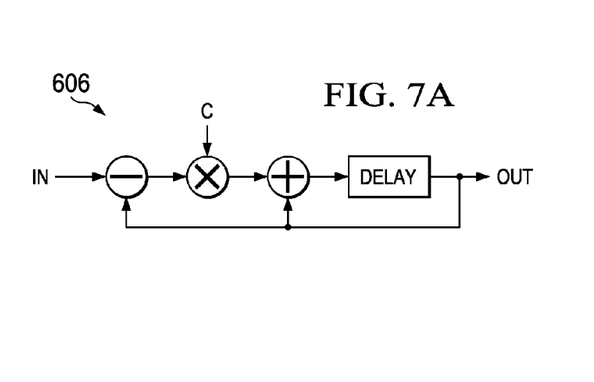
FIGS. 7A and 7B depict example integrator filters for use in the variable bandwidth filter depicted in FIG. 6, in accordance with embodiments of the present disclosure.
Figure 7B:
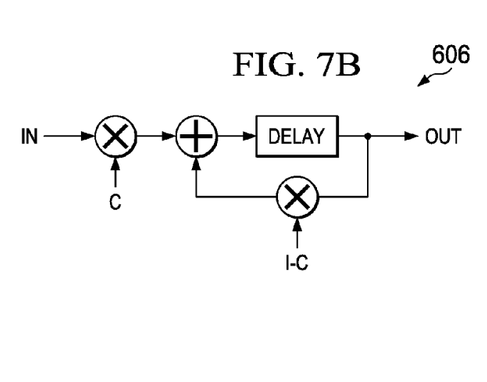

In some embodiments, one or both of low-pass filters 606 may be implemented using leaky integrator filters. Possible implementations of leaky integrator filters for use as low-pass filters 606 are shown in FIGS. 7A and 7B.

As used herein, when two or more elements are referred to as "coupled" to one another, such term indicates that such two or more elements are in electronic communication whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An apparatus comprising:
    a variable bandwidth filter having:
        a data input for receiving an input signal;
        a data output for generating an output signal; and
        a control input for receiving a bandwidth control signal;
    wherein:
        a bandwidth of the variable bandwidth filter is in conformity with the bandwidth control signal;
        the output signal is generated by filtering the input signal in conformity with the bandwidth of the variable bandwidth filter; and
        the the bandwidth control signal is generated based on an integrated error between the input signal and the output signal.

2. The apparatus of claim 1, further comprising a fixed bandwidth averaging filter having a second input for receiving a raw input signal and a second output for generating the data signal, wherein the data signal is generated by averaging the raw input signal in conformity with a fixed bandwidth of the fixed bandwidth averaging filter.

3. The apparatus of claim 2, wherein the fixed bandwidth filter is an averaging filter raw signal is indicative of a raw phase angle.

4. The apparatus of claim 1, wherein the raw phase angle is indicative of a control setting of a dimmer in a lighting system.

5. The apparatus of claim 4, further comprising a power train configured to transfer electrical energy from a power train input to a load coupled to a power train output in conformity with the output signal.

6. The apparatus of claim 4, wherein the load comprises a lamp.

7. The apparatus of claim 6, wherein the lamp comprises a light-emitting diode lamp.

8. The apparatus of claim 1, wherein the variable bandwidth filter comprises a first low-pass filter, the apparatus further comprising:

a second low-pass filter configured to generate an integrated error signal, indicative of a difference between the input signal and the output signal, wherein the integrated error signal is determinative of the bandwidth control signal.

9. The apparatus of claim 8, wherein a bandwidth of the second low-pass filter is controlled by a second control signal.

10. The apparatus of claim 8, further comprising:
    an absolute value block for generating an absolute value signal indicative of an absolute value of the integrated error signal, wherein the absolute value signal is determinative of the bandwidth control signal.

11. The apparatus of claim 10, further comprising:
    a combiner for performing a mathematical transform of the absolute value signal and for generating a combiner output signal indicative of the mathematical transform, wherein the combiner output signal corresponds to the bandwidth control signal.

12. The apparatus of claim 11, wherein the combiner comprises and adder for adding a constant to the absolute value signal, wherein the constant is indicative of a minimum bandwidth of the variable bandwidth filter.

13. A method comprising:
    receiving a bandwidth control signal, indicative of an integrated error between an input signal and an output signal;
    setting a bandwidth of a variable bandwidth filter in accordance with the bandwidth control signal; and
    generating an output signal from an input signal by filtering the input signal in conformity with the bandwidth of the variable bandwidth filter.

14. The method of claim 13, further comprising generating the input signal from a second input signal by filtering the second input signal in conformity with a fixed bandwidth of a fixed bandwidth filter.

15. The method of claim 14, wherein filtering the second input signal comprises averaging the second input signal.

16. The method of claim 13, wherein the input signal is indicative of a control setting of a dimmer in a lighting system.

17. The method of claim 16, further comprising transferring electrical energy from a power train input to a load in conformity with the output signal.

18. The method of claim 17, wherein the load comprises a lamp.

19. The method of claim 17, wherein the lamp comprises a light-emitting diode lamp.

20. The method of claim 13, wherein generating the output signal further comprises:
    low-pass filtering the input signal to generate the output signal, wherein the first-low pass filter has a bandwidth equal to the variable bandwidth; and
    low-pass filtering a difference between the input signal and the output signal to generate the integrated error.

* * * * *